United States Patent
Haurie et al.

(10) Patent No.: US 7,259,706 B2
(45) Date of Patent: Aug. 21, 2007

(54) BALANCED DUAL RESISTOR STRING DIGITAL TO ANALOG CONVERTER SYSTEM AND METHOD

(75) Inventors: Xavier Haurie, Calgary (CA); Paul Ferguson, Jr., North Andover, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/272,252

(22) Filed: Nov. 10, 2005

(65) Prior Publication Data

US 2006/0103564 A1    May 18, 2006

Related U.S. Application Data

(60) Provisional application No. 60/627,577, filed on Nov. 12, 2004.

(51) Int. Cl.
*H03M 1/78* (2006.01)
(52) U.S. Cl. ........................ 341/154; 341/144
(58) Field of Classification Search ................ 341/144, 341/145, 154
See application file for complete search history.

(56) References Cited

U.S. PATENT DOCUMENTS

| | | | |
|---|---|---|---|
| 3,997,892 A | 12/1976 | Susset | |
| 4,338,591 A | 7/1982 | Tuthill | |
| 5,014,054 A | 5/1991 | Oshita et al. | |
| 5,495,245 A | 2/1996 | Ashe | |
| 5,568,147 A * | 10/1996 | Matsuda et al. | ............ 341/154 |

(Continued)

FOREIGN PATENT DOCUMENTS

| EP | 1098443 | 11/2000 |
|---|---|---|
| EP | 1184989 | 8/2001 |

OTHER PUBLICATIONS

Gryzbowski et al., "Non-linear Functions from D/A Converters," Electronic Engineering 1971, pp. 48-51, no month.

*Primary Examiner*—Peguy JeanPierre
(74) *Attorney, Agent, or Firm*—Gauthier & Connors LLP (57) ABSTRACT

A digital to analog converter system is disclosed for receiving an input signal and a sign bit signal that is indicative of the sign of the input signal. The digital to analog converter system includes first and second pairs of resistor strings, and first and second switching networks. A first one of the first pair of resistor strings is adapted for coupling between a first voltage potential and an intermediate node. The first switching network is adapted to couple a voltage produced across a selected one of resistors in the first string across the second one of the resistor strings. The resistors in the second resistor string producing voltages in response to current passing from the first resistor string to the second resistor string through the first switching network. A third one of the second pair of resistor strings is adapted for coupling between a second voltage potential and the intermediate node. The second switching network is adapted to couple a voltage produced across a selected one of resistors in the third string across the fourth one of the resistor strings. The resistors in the fourth resistor string produce voltages in response to current passing from the third resistor string to the fourth resistor string through the second switching network.

12 Claims, 5 Drawing Sheets

U.S. PATENT DOCUMENTS

| | | |
|---|---|---|
| 5,627,537 A | 5/1997 | Quinlan et al. |
| 5,648,780 A | 7/1997 | Neidorff |
| 5,696,657 A | 12/1997 | Nourrcier, Jr. et al. |
| 5,831,566 A | 11/1998 | Ginetti |
| 6,567,026 B1 * | 5/2003 | Gorman ..................... 341/154 |
| 6,621,440 B2 * | 9/2003 | Gorman ..................... 341/154 |
| 6,724,336 B2 * | 4/2004 | Leung et al. ............... 341/145 |
| 6,778,122 B2 * | 8/2004 | Lien ........................... 341/154 |
| 6,937,178 B1 * | 8/2005 | Rempfer et al. ............ 341/154 |
| 2002/0145552 A1 | 10/2002 | Gorman |

* cited by examiner

FIG. 5 ns by the BALANCED DUAL RESISTOR STRING DIGITAL TO ANALOG CONVERTER SYSTEM AND METHOD

PRIORITY

The present application claims priority to U.S. Provisional Patent Application Ser. No. 60/627,577 filed Nov. 12, 2004.

BACKGROUND OF THE INVENTION

This invention relates generally to digital to analog converters (DACS) and more particularly to resistor string DACs adapted for integrated circuit fabrication.

As is known in the art, DACs have been used in a wide variety of applications to convert an N-bit digital word into a corresponding analog signal. One such DAC includes a string of $2^N$ resistors having substantially the same resistance serially connected across a reference voltage. Thus, the resistor string divides the reference voltage among the resistors in the string. A switching network is provided for coupling the voltage at one of the resistors to an output to produce the converted voltage. While such DAC is suitable for applications where N is relatively small, when N is large, for example, where N is in the order of twelve, 4,096 resistors, 4,096 switches, and 4,096 control lines are required thereby resulting in a relatively large number of elements to be fabricated on an integrated circuit chip.

One technique to reduce the number of elements is to use a segmented converter. In a segmented converter, a first stage uses a resistor string for converting a group of higher order bits of the N-bit digital word and a second stage decodes the remaining, lower order bits. A non-linear converter of that general type is shown in an article by Gryzbowski et al., entitled "Non-liner Functions from D/A Converters", Electronic Engineering 1971, pgs. 48–51. The converter disclosed therein is designed for operation with relay switching and is not readily adapted to modern semiconductor technology. Another segmented converter is described in U.S. Pat. No. 3,997,892, which discloses a segmented converter that includes a resistor string for both the first and second stages with buffer amplifiers between the stages to prevent the second stage resistor string from loading the first resistor string.

Still another type of segmented converters is described in U.S. Pat. No. 4,338,591, which discloses a segmented converter in which a resistor string is used for the first stage, an R-2R DAC is used for the second stage and buffer amplifiers are used between the first and second stages to reduce the effect of loading by the second stage on the first stage. The voltage produced across a selected one of the resistors in the first resistor string is fed across the second resistor string through the buffer amplifiers.

A third type of segmented DAC is described in U.S. Pat. No. 5,495,245. The DAC described therein includes a pair of first stage resistor strings coupled to a second resistor string through a first switching network. A pair of reference voltages are coupled to the pair of resistor strings. The first switching network operates such that a voltage produced at a selected one of the resistors in one of the pair of first stage resistor strings and a voltage produced at a selected one of the resistors in the other one of the pair of first resistor strings are coupled across the second stage resistor string. A second switching network couples an output at a selected one of the resistors in the second resistor string to an output of the DAC. Buffer amplifiers are not included between the pair of first stage resistor strings and the second stage resistor string. Two arrangements are described. In one arrangement, the first switching network responds to the MSBs and the second switching network responds to the LSBs. In the other arrangement, the first switching network responds to the LSBs and the second switching network responds to the MSBs. In former arrangement, each resistor in the pair of resistor strings has a value $2^N R$, where R is the resistance of each of the $2^{N/2}$ resistors in the second resistor string. In the latter arrangement, each resistor in the second resistor string has a value $2^{N/2} R$, where R is the resistance of each resistor in the pair of first resistor strings. In both arrangements, the entire current passing between the pair of reference voltages passes through the resistors. Therefore, while such arrangements are useful in many applications the relatively high number of resistors which are required in both the first and second pairs of resistor strings thereby requiring relative large chip surface area for their fabrication.

A fourth technique involves providing a pair of resistor strings as disclosed in U.S. Pat. No. 5,696,657. A first one of the resistor strings is adapted for coupling across a voltage supply. The resistors in the first resistor string produce voltages in response to current fed thereto from the voltage supply. The second string of resistors has a plurality of m resistors of substantially equal resistance serially coupled between a pair of second resistor string input terminals, where m is an odd integer. A first switching network has a pair of switch output terminals connected to the second resistor string input terminals. The first switching network is adapted to couple terminals of a selected one of the resistors in the first string to the pair of switch output terminals. The resistors in the second resistor string produce voltages in response to current passing between the first resistor string and the second resistor string through the first switching network. A second switching network is adapted to couple a selected one of the voltages produced at a terminal of a selected one of the resistors in the second resistor string to an output of the converter. The resistance across the second resistor string is larger than the resistance of the selected one of the resistors in the first resistor string. The resistances of the second mentioned string and resistance of the first switching network, may be selected to produce a step change of substantially one LSB at the converter output, where LSB is the least significant bit of a digital word converted by the converter, when the first switching network switches from coupling one of the selected first resistors to the pair of output terminals to coupling the one of the first resistors successively serially coupled to the selected first resistors to the output terminals thereof.

Figure 1:
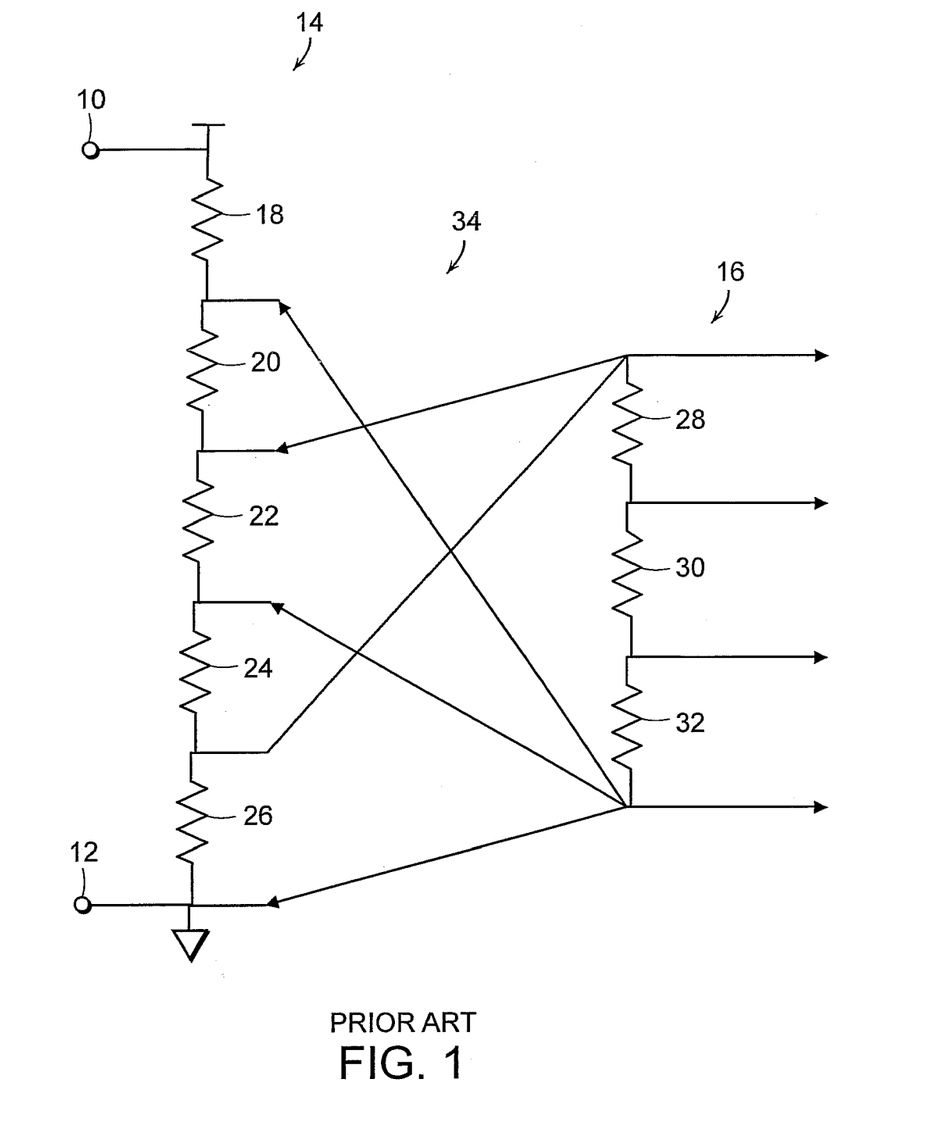
FIG. 1 shows an illustrative diagrammatic view of a resistor string DAC in accordance with the prior art'

For example, FIG. 1 shows a dual resistor string DAC that includes a first resistor string 14 and a second resistor string 16. The first resistor string 14 is coupled to input nodes 10 and 12, and includes resistors 20, 22, 24 and 26 as shown. The second resistor string 16 includes resistors 28, 30 and 32, which may be switched into a parallel connection with any of resistors 20–26 via a switching network 34.

In certain applications however, there is a need to provide a DAC that receives the same digital input information, and provides balanced positive and negative DAC outputs around a given mid-scale voltage responsive to the input digital signal information. In addition, when the DAC is used as a sub-DAC within a system as described in Shabra, Proceedings of CICC 2004, where a sign-and-magnitude encoding of the digital signal is used, there is a need for the balanced DAC to respond correctly to changes in the sign bit value and to changes in the main DAC value.

There is a need, therefore, for an economical and efficient method for producing balanced positive and negative DAC output responsive to an input digital signal, and such that they may be used in a sub-DAC and main-DAC arrangement.

SUMMARY OF THE INVENTION

The invention provides a digital to analog converter system for receiving an input signal and a sign bit signal that is indicative of the sign of the input signal. The digital to analog converter system includes first and second pairs of resistor strings, and first and second switching networks. A first one of the first pair of resistor strings is adapted for coupling between a first voltage potential and an intermediate node. The first switching network is adapted to couple a voltage produced across a selected one of resistors in the first string across the second one of the resistor strings. The resistors in the second resistor string producing voltages in response to current passing from the first resistor string to the second resistor string through the first switching network. A third one of the second pair of resistor strings is adapted for coupling between a second voltage potential and the intermediate node. The second switching network is adapted to couple a voltage produced across a selected one of resistors in the third string across the fourth one of the resistor strings. The resistors in the fourth resistor string produce voltages in response to current passing from the third resistor string to the fourth resistor string through the second switching network.

BRIEF DESCRIPTION OF THE DRAWINGS

The following description may be further understood with reference to the accompanying drawings in which.

The drawings are shown for illustrative purposes only.

DETAILED DESCRIPTION OF THE ILLUSTRATED EMBODIMENTS

Figure 2:
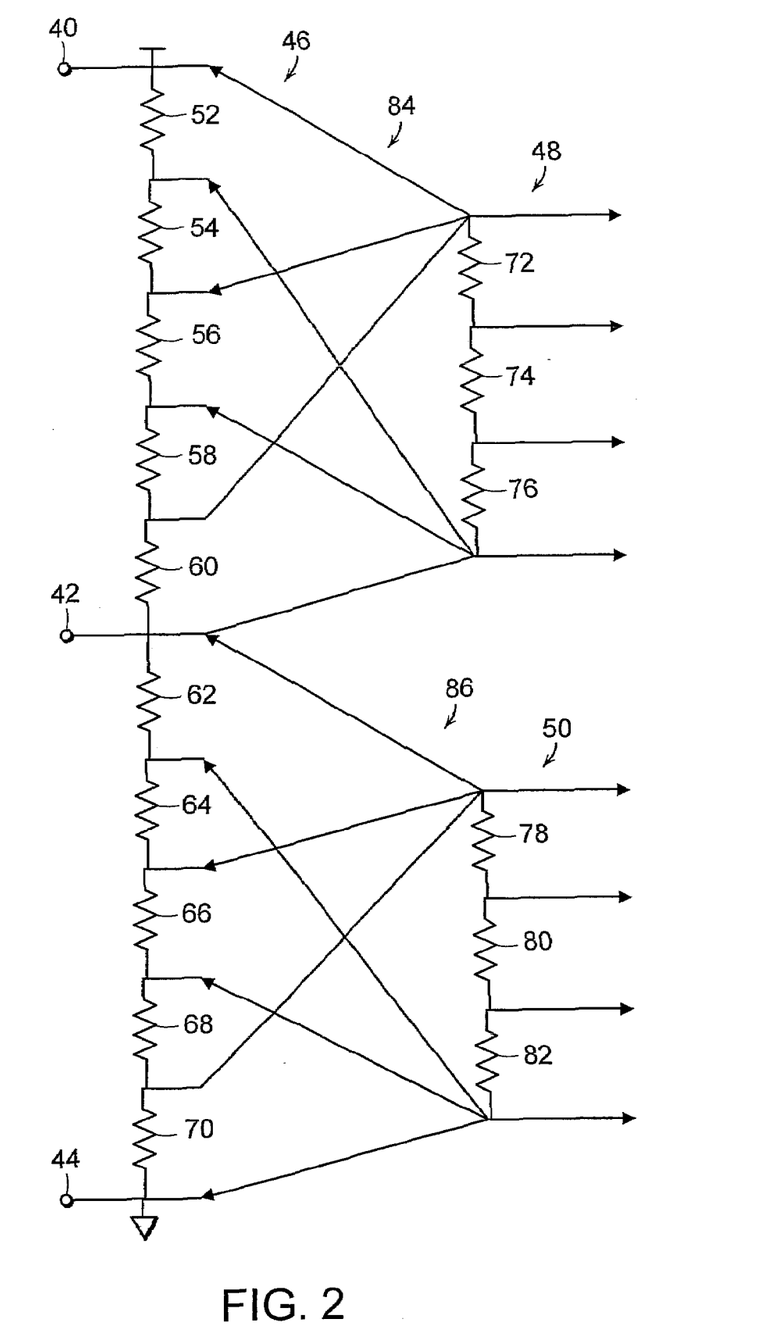
FIG. 2 shows an illustrative diagrammatic view of a balanced resistor string DAC in accordance with an embodiment of the invention.

As shown in FIG. 2, a balanced DAC may be formed in accordance with an embodiment of the invention that includes a first resistor string 46 and two separate second resistor strings 48 and 50 on either side of the center of the string 46. The first part of the first resistor string is coupled to input nodes 40 and 42, and includes resistors 52, 54, 56 and 58. The second part of the resistor string 46 is coupled to input nodes 42 and 44, and includes resistors 64, 66, 68 and 70. The first of the two second resistor strings includes resistors 72, 74 and 76, and may be coupled in parallel with any of the resistors 52, 54, 56 and 58 via switching network 84. The second of the two second resistor strings includes resistors 78, 80 and 82, and may be coupled in parallel with any of the resistors 64, 66, 68 and 70 via switching network 86.

The circuit provides, in effect, that two resistor string DACs are placed in series with one another, and that they are addressed from the middle to either $V_{ref}$ or to ground depending on the sign bit. One issue that may arise, however, is that the code for zero may have an offset due to a resistance inherent in the switches ($R_{SW}$) between the resistors 76 and 60, and between resistors 78 and 62. The switches may also include an inherent capacitance ($C_{SW}$). Another is that the end code is less than one LSB from full scale. These issues may present limitations in certain applications.

Figure 3:
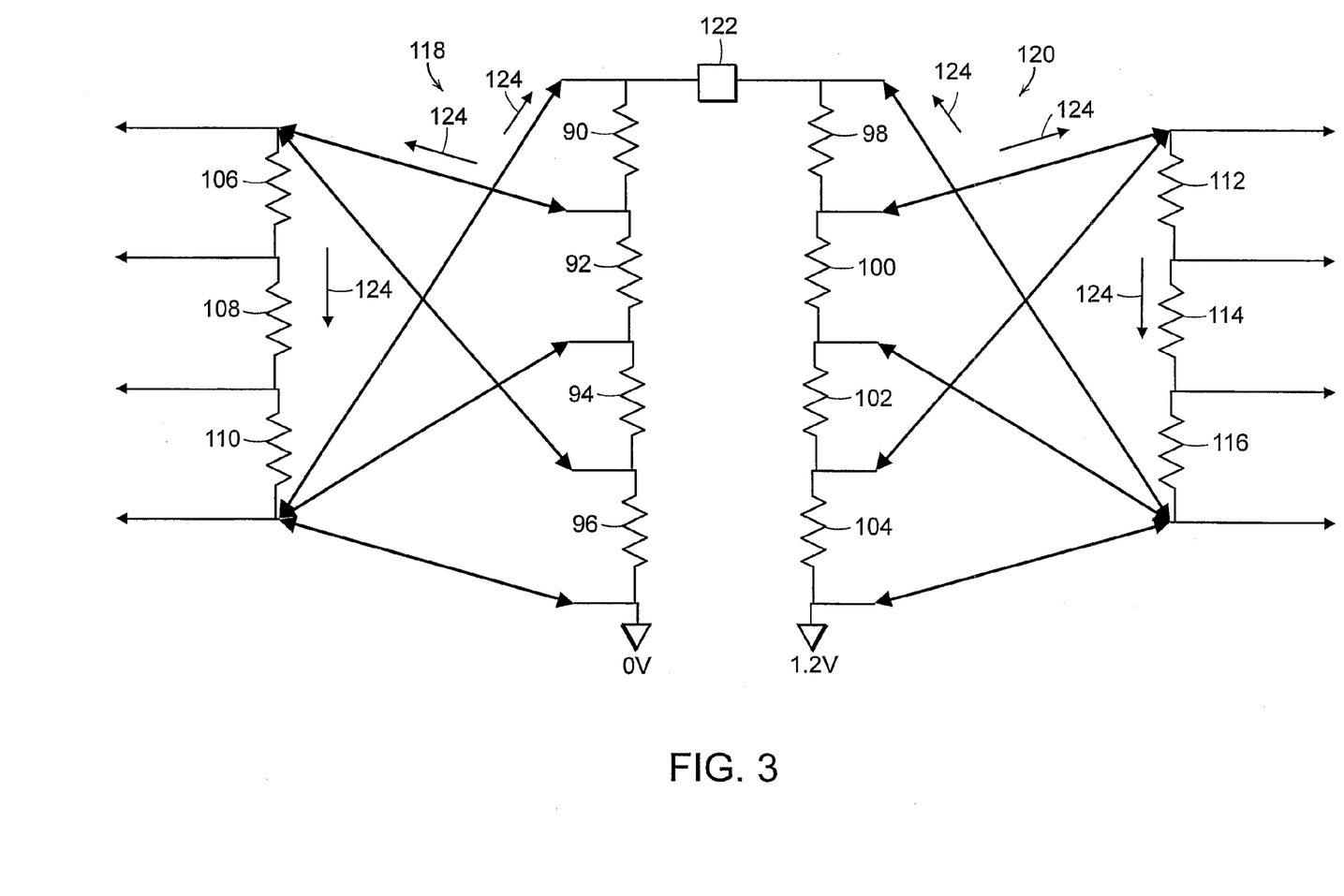
FIG. 3 shows an illustrative diagrammatic view of a balanced resistor string DAC in accordance with another embodiment of the invention.

In particular, as shown in FIG. 3, a similar circuit to that shown in FIG. 2 is shown in two parts in which a first half of a first resistor string includes resistors 90, 92, 94 and 96, while a second half of the first resistor string includes resistors 98, 100, 102 and 104. A first of two second resistor strings includes resistors 106, 108 and 110, and may be coupled to any of the resistor 90, 92, 94 or 96 via switches 118. A second of the two second resistor strings includes resistors 112, 114 and 116, and may be coupled to any of the resistors 98, 100, 102 or 104 via switches 120. An additional small resistance 122 that is on the order of $R_{SW}$ may be placed between the resistors 90 and 98 in the first resistor string. When a change in connection is made to place any of the resistors in the second strings to be in parallel with any of the resistors in the first string, the potentials change such that the voltage may drop about 1 LSB. This is shown diagrammatically by the arrows as indicated at 124 in FIG. 3. In specific implementations, the first half of the first resistor string may include sixteen MSB resistors, and each second resistor string may include seven LSB resistors.

Figure 4:
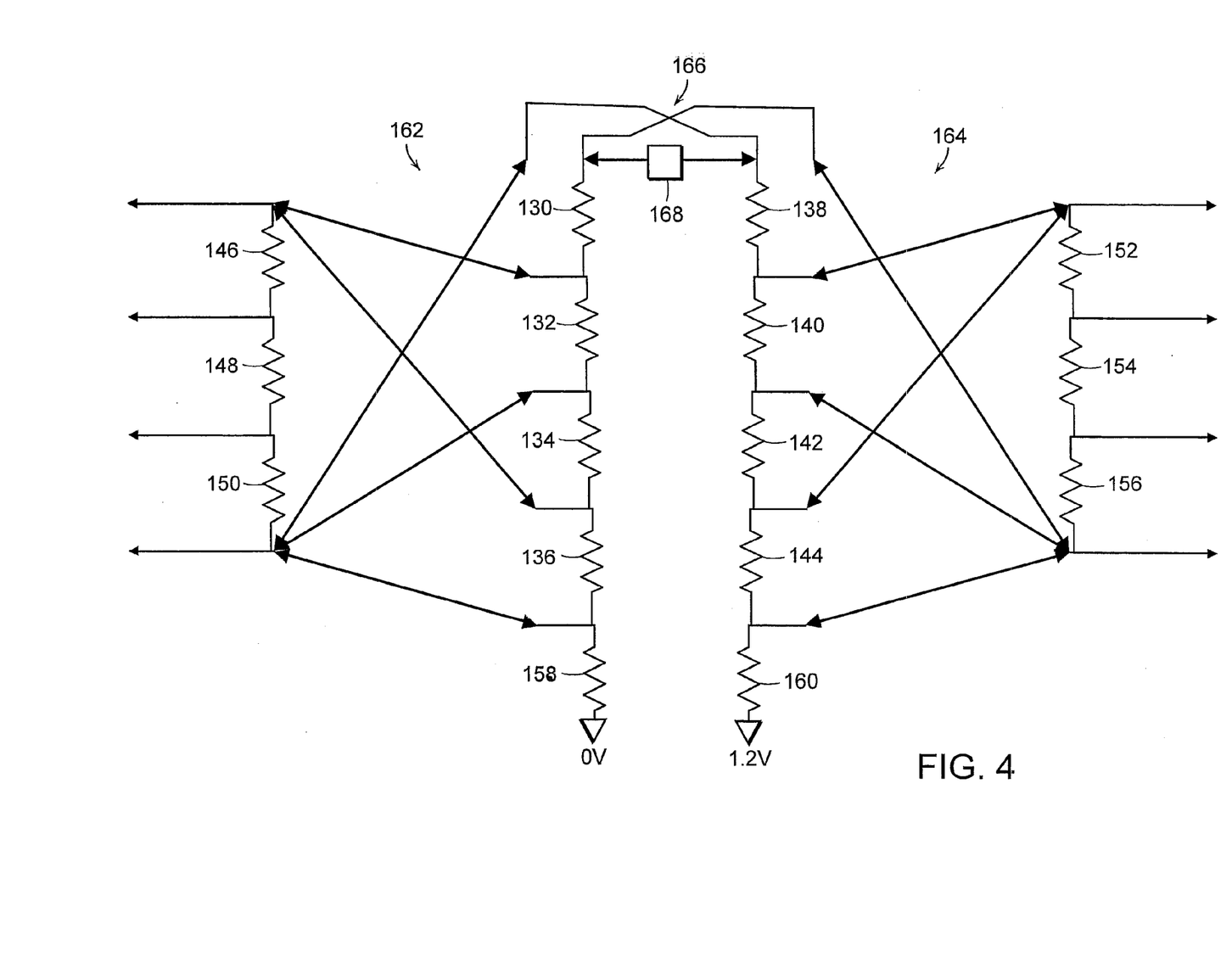
FIG. 4 shows an illustrative diagrammatic view of a balanced resistor string DAC in accordance with a further embodiment of the invention.

FIG. 4 shows a further embodiment of the invention that includes a first half of a first resistor string including resistors 130, 132, 134 and 136, while a second half of the first resistor string includes resistors 138, 140, 142 and 144. A first of two second resistor strings includes resistors 146, 148 and 150, and may be coupled to any of the resistors 136, 132, 134 or 136 via switches 162. A second of the two second resistor strings includes resistors 152, 154 and 156, and may be coupled to any of the resistors 138, 1140, 142 or 144 via switches 164. The system also includes a small resistor 168 between the resistors 130 and 138, as well a resistor 158 between the resistor 136 and ground, and a resistor 160 between the resistor 144 and the positive voltage source. In addition, the circuit provides that there is a crossover as indicated at 166 between the switches 162 and the lower end of the portion of the first resistor string that is associated with the second of the pair of second resistors. There is also a cross over between the switches 164 and the upper end of the portion of the first resistor string that is associated with the first of the pair of second resistors.

Figure 5:
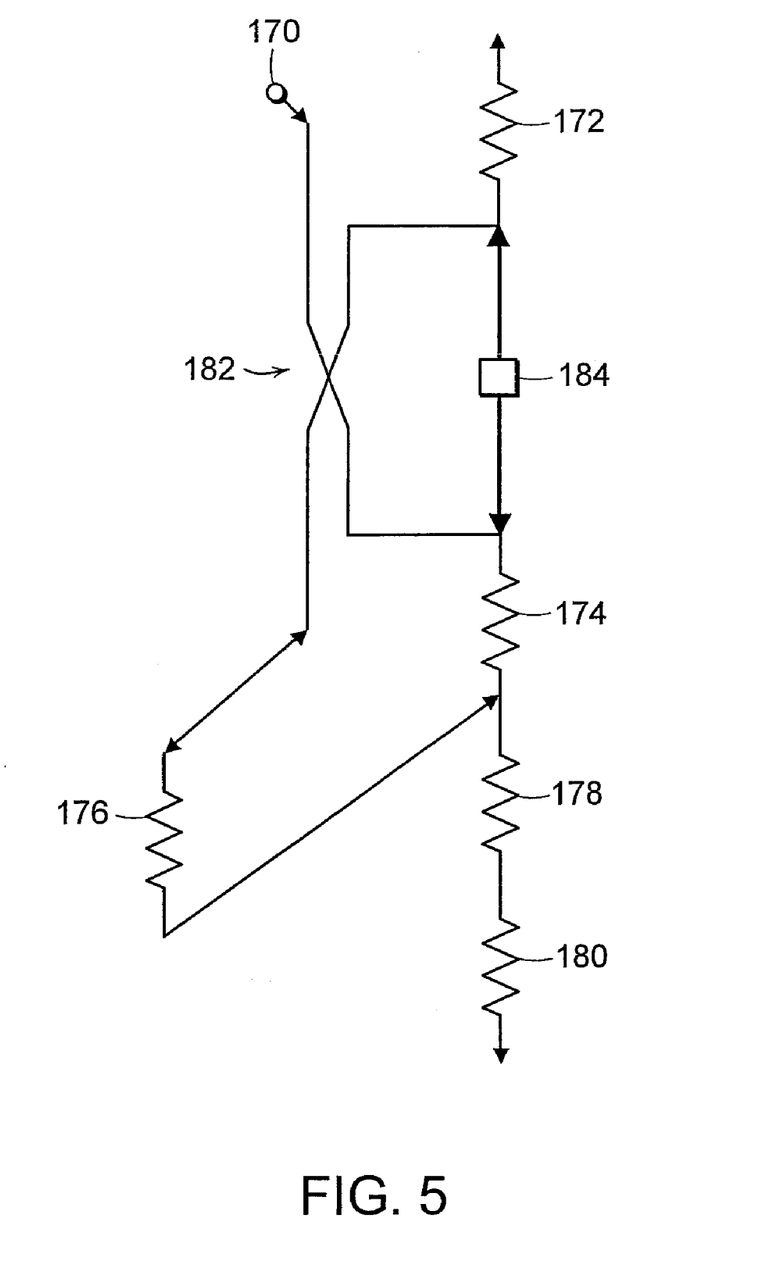
FIG. 5 shows an illustrative diagrammatic view of a portion of the balanced resistor string DAC of FIG. 4.

This cross-over is more clearly shown in FIG. 5 in which a resistor ($R_{lsb}$) 170 is coupled to one side of a resistor ($R_{msb}$) 174 of a first resistor string, while a resistor ($R_{lsb}$) 176 from a second resistor string is coupled to a resistor ($R_{msb}$) 172 of the first resistor string. The first resistor string may also include additional resistors ($R_{msb}$) 178 and ($R_{msb}$) 180 as shown, and may include a mid resistor ($R_{mid}$) 184 as shown. In accordance with an embodiment, the current through the resistor 184 ($R_{mid}$) is $I_{mid}$, which may be set to $I_{msb}/14$. The current from resistor ($R_{lsb}$) 170 through a switch ($R_{SW}$) may be $I_{lsb}$ and the current flowing toward the resistor 176 through an associated switch ($R_{SW}$) may also be $I_{lsb}$. For points between the bottom of resister ($R_{lsb}$) 170 and the top of the resistor 176 to be at the same potential, $2 R_{SW} I_{lsb}$ must equal $R_{mid} I_{msb}$. This means that $R_{mid}$ must equal $R_{SW}/7$. The resistor $R_{mid}$ may be implemented by using the equivalent of 6½ closed switches in parallel. This should correct for the offset at code zero issue.

With regard to the minor carry issue, if $R_{lsb}=2 R_{msb}$, the RSW approaches zero. In this case, connecting below a given MSB node brings that node's voltage down by 1.14 LSB since $R_{msb}\|7R_{lsb}=R_{msb}\|14R_{msb}=R_{msb}(1-1.14\times1/16)$. With regard to the major carry issue, if the value of each of the resistors 158 and 160 ($R_{end}$) is about ½ LSB each, then $R_{end}=2R_{lsb}/14=R_{SW}/14$. With $R_{msb}=385\Omega$, $R_{SW}=165\Omega$ and $R_{end}=43\Omega$. This may be implemented with 11 $R_{msb}$ units in parallel.

Systems of the present invention, therefore, may provide balanced impedance. Because it feeds a switched-capacitor, each end of the resistor DAC should present the same impedance for a given code. Switches are scaled (in 5 groups) such that $R_{SW}=165\Omega$ and $C_{SW}=50$ fF. The sizes are derived from the 1.2 v switch that is 20/0.24. Looking into the DAC outputs, the resistor DAC architecture itself presents the same impedance when connected for code x and as well as for full scale as long as the ground and $V_{ref}$ impedances are also matched. With regard to settling, maximum resistance is seen looking into a single output: 8 $R_{msb}=3$ k., and the sampling switch resistance equal to 2 k max)5/0.24). With the absolute maximum capacitance at 16 ns/6/5 k=53 fF, a single capacitor may be 117 fF nominal and 140 fF max, and the three R DAC switches may be 150 fF, leaving more than 200 fF for routing and error.

Those skilled in the art will appreciate that numerous modifications and variations may be made to the above disclosed embodiments without departing from the spirit and scope of the invention.

What is claimed is:

1. A digital to analog converter system for receiving an input signal and a sign bit signal that is indicative of the sign of the input signal, said digital to analog converter system comprising:
    a first pair of resistor strings, a first one of the first pair of resistor strings being adapted for coupling between a first voltage potential and an intermediate node;
    a first switching network adapted to couple a voltage produced across a selected one of resistors in the first string across the second one of the resistor strings, the resistors in the second resistor string producing voltages in response to current passing from the first resistor string to the second resistor string through the first switching network;
    a second pair of resistor strings, a third one of the second pair of resistor strings being adapted for coupling between a second voltage potential and the intermediate node; and
    a second switching network adapted to couple a voltage produced across a selected one of resistors in the third string across the fourth one of the resistor strings, the resistors in the fourth resistor string producing voltages in response to current passing from the third resistor string to the fourth resistor string through the second switching network.

2. The digital to analog converter as claimed in claim 1, wherein said first and second switching networks are each responsive to the most significant bits of the digital input.

3. The digital to analog converter as claimed in claim 1, wherein said first pair of resistor strings includes a third switching network adapted to couple a voltage produced across a selected a second of resistors in the first string across the second one of the resistor strings, the resistors in the second resistor string producing voltages in response to current passing from the first resistor string to the second resistor string through the third switching network.

4. The digital to analog converter as claimed in claim 1, wherein said second pair of resistor strings includes a fourth switching network adapted to couple a voltage produced across a selected a second of resistors in the third string across the fourth one of the resistor strings, the resistors in the fourth resistor string producing voltages in response to current passing from the third resistor string to the fourth resistor string through the fourth switching network.

5. The digital to analog converter as claimed in claim 1, wherein said digital to analog converter provides balanced impedance to any input code.

6. The digital to analog converter as claimed in claim 1, wherein said intermediate node is a center node.

7. A digital to analog converter system for receiving an input signal and a sign bit signal that is indicative of the sign of the input signal, said digital to analog converter system comprising:
    a first pair of resistor strings, a first one of the first pair of resistor strings being adapted for coupling between a first voltage potential and a center node, resistors in the first resistor string producing voltages in response to current fed thereto from the voltage supply and a second one of the resistor strings comprising only 2n+1 resistors where n is a positive integer, each resistor in the second string having a pair of terminals;
    a first switching network adapted to couple a voltage produced across a selected one of resistors in the first string across the second one of the resistor strings, the resistors in the second resistor string producing voltages in response to current passing from the first resistor string to the second resistor string through the first switching network;
    a second pair of resistor strings, a third one of the second pair of resistor strings being adapted for coupling between a second voltage potential and a center node, resistors in the third resistor string producing voltages in response to current fed thereto from the voltage supply and a fourth one of the resistor strings comprising only 2n+1 resistors where n is a positive integer, each resistor in the fourth string having a pair of terminals; and
    a second switching network adapted to couple a voltage produced across a selected one of resistors in the third string across the fourth one of the resistor strings, the resistors in the fourth resistor string producing voltages in response to current passing from the third resistor string to the fourth resistor string through the second switching network;
    wherein the resistance across the second resistor string is larger than the resistance of the selected one of the resistors in the first resistor string, and the resistance across the third resistor string is larger than the resistance of the selected one of the resistors in the third resistor string.

8. The digital to analog converter as claimed in claim 7, wherein said first and second switching networks are each responsive to the most significant bits of the digital input.

9. The digital to analog converter as claimed in claim 7, wherein said first pair of resistor strings includes a third switching network adapted to couple a voltage produced across a selected a second of resistors in the first string across the second one of the resistor strings, the resistors in the second resistor string producing voltages in response to current passing from the first resistor string to the second resistor string through the third switching network.

10. The digital to analog converter as claimed in claim 7, wherein said second pair of resistor strings includes a fourth switching network adapted to couple a voltage produced across a selected a second of resistors in the third string across the fourth one of the resistor strings, the resistors in the fourth resistor string producing voltages in response to current passing from the third resistor string to the fourth resistor string through the fourth switching network.

11. The digital to analog converter as claimed in claim 7, wherein said digital to analog converter provides balanced impedance to any input code.

12. The digital to analog converter as claimed in claim 7, wherein said intermediate node is a center node.

* * * * *